United States Patent [19]

Lichti

[11] Patent Number: 4,535,346

[45] Date of Patent: Aug. 13, 1985

[54] DRIVE CIRCUIT FOR PIEZOELECTRIC TRANSDUCER IN INK JET PRINTERS

[75] Inventor: Reiner Lichti, Germering, Fed. Rep. of Germany

[73] Assignee: Siemens Aktiengesellschaft, Berlin & Munich, Fed. Rep. of Germany

[21] Appl. No.: 493,317

[22] Filed: May 10, 1983

[30] Foreign Application Priority Data

Jun. 24, 1982 [DE] Fed. Rep. of Germany ....... 3223636

[51] Int. Cl.$^3$ ............................................. G01D 15/16
[52] U.S. Cl. .................................. 346/140 R; 310/317
[58] Field of Search ................. 346/140 PD; 310/317, 310/326

[56] References Cited

U.S. PATENT DOCUMENTS

| 3,902,083 | 8/1975 | Zoltam | 310/317 |
| 4,161,670 | 7/1979 | Kern | 346/140 PD |
| 4,459,599 | 7/1984 | Ort | 346/140 PD |

Primary Examiner—E. A. Goldberg
Assistant Examiner—Mark Reinhart
Attorney, Agent, or Firm—Hill, Van Santen, Steadman & Simpson

[57] ABSTRACT

A drive circuit for a piezoelectric transducer in an ink jet printer incorporates a resonant circuit formed of an inductance and a piezoelectric transducer functioning as a capacitance, with the resonant circuit being excited to oscillation by means of current pulses, and with such oscillation being damped by means of a damping circuit, said damping beginning after a time delay relative to the onset of said oscillation.

3 Claims, 7 Drawing Figures

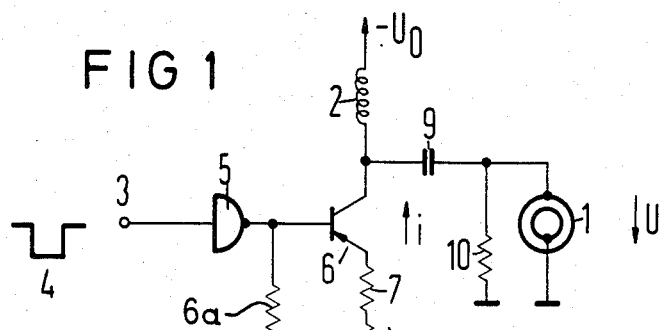
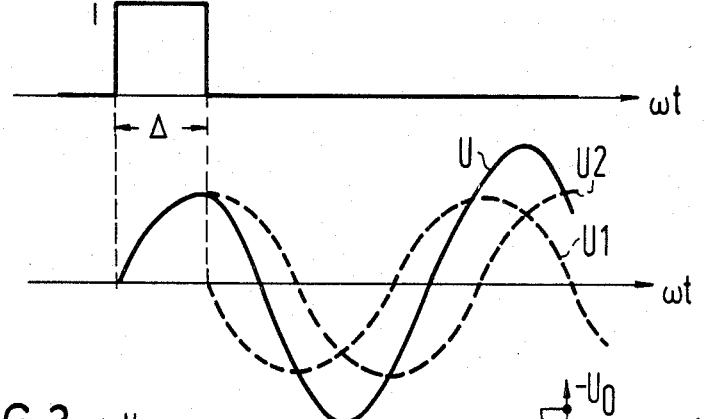
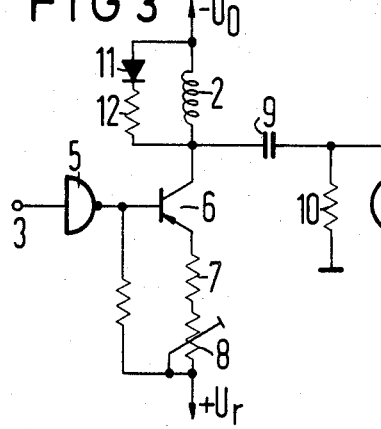
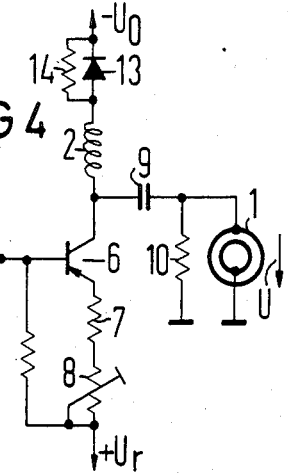

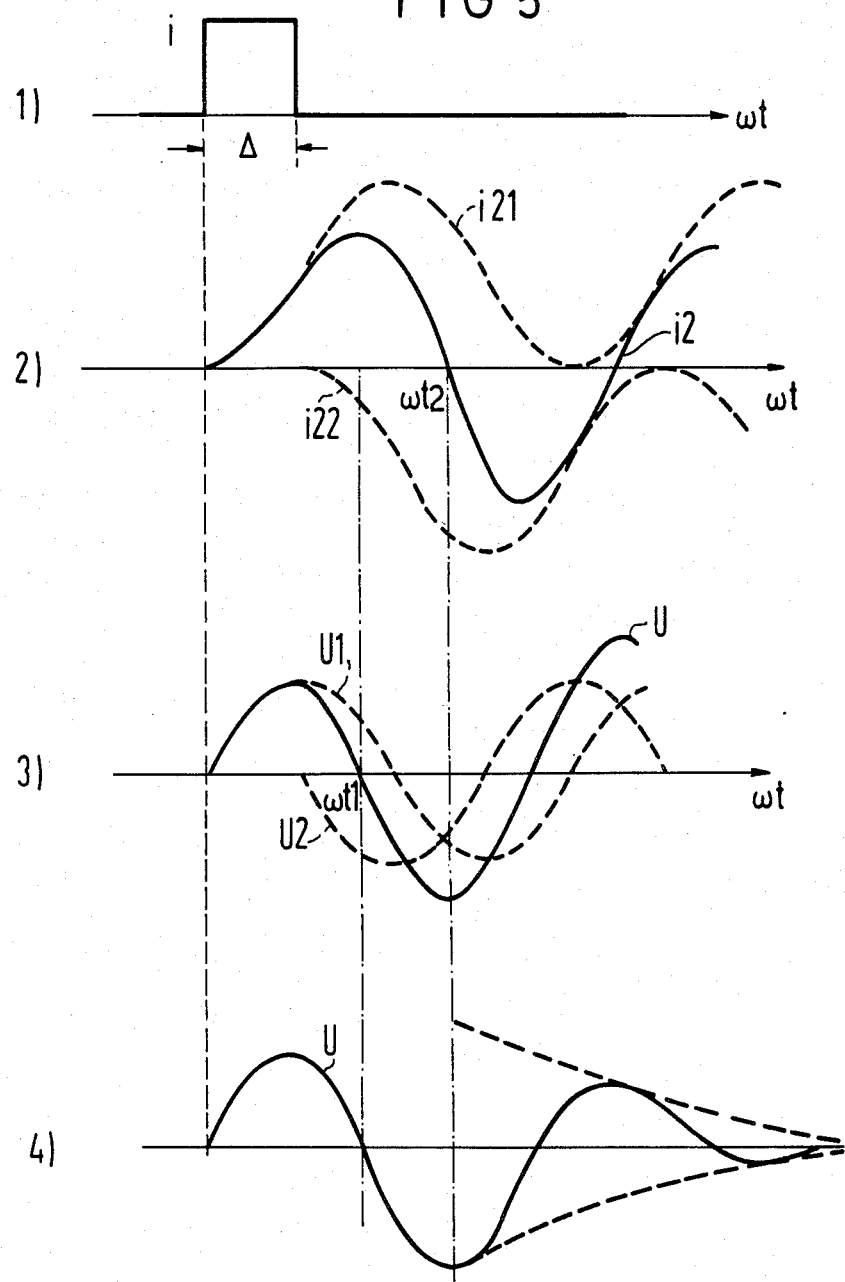

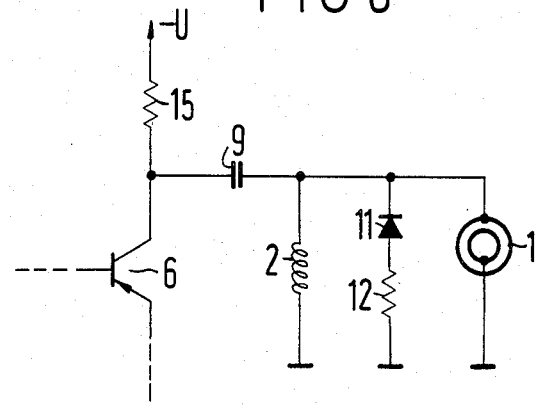
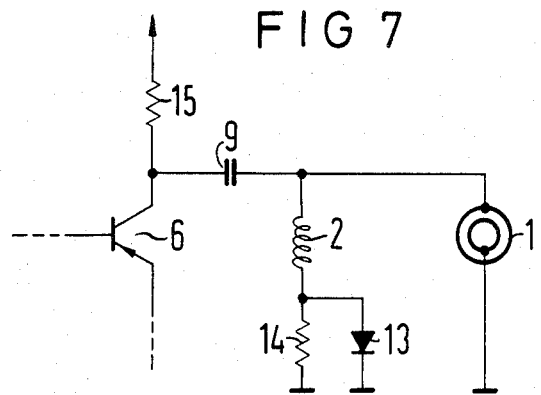

DRIVE CIRCUIT FOR PIEZOELECTRIC TRANSDUCER IN INK JET PRINTERS

FIELD OF THE INVENTION

The present invention relates to ink jet printers of the type having a tubular piezoelectric transducer surrounding a fluid ink conduit, and more particularly to drive circuits for such transducers.

PRIOR ART

Piezoelectric transducers for ink jet printers have been known in which the piezoelectric element surrounding the fluid ink conduit is caused first to expand by applying a voltage opposite the polarization direction, and then to constrict such transducer by reversing the polarity of the drive voltage applied thereto. Such a system is described in U.S. Pat. No. 4,161,670. During the expansion of the transducer, a small amount of ink fluid is drawn into the transducer, and during contraction, a droplet is ejected from the conduit. In a previously developed circuit, a transformer is provided for each of the piezoelectric transducers, for supplying a pulse to the transducer from an amplifier. The inductance of the secondary of the transformer forms a resonant circuit with a piezoelectric transducer, which has an effective capacitance. Accordingly, a pulse applied to the primary of the transformer produces a voltage surge at the secondary, poled so as to cause the transducer to expand. At the trailing edge of the pulse, a voltage is induced in the opposite direction, which triggers a contraction of the transducer. The oscillations produced in the secondary circuit of the transformer can be damped so that they decay after a short time. Because of the use of the transformer, the drive circuit requires a considerable amount of space, which is very disadvantageous, particularly in connection with write heads for ink jet printers which have a great number of closely spaced jets. The voltage levels required for the piezoelectric transducers in ink jet printers must have levels up to 300 volts, which is readily accomplished by means of a transformer. However, the space required for the transformer circuit is a great disadvantage of previously known arrangements. Accordingly, it is desireable to provide an apparatus which does not have these disadvantages.

BRIEF DESCRIPTION OF THE INVENTION

It is a principle object of the present invention to provide a circuit arrangement which has a considerably reduced space requirement and yet provides the voltage values required for driving the piezoelectric transducers, and in which the wave shape of the voltage applied to the piezoelectric transducer can be predetermined within wide limits.

Another object of the present invention is to provide such a circuit in which the power requirements and temperature dependency is relative low.

In accordance with one embodiment of the present invention, a driving circuit for a piezoelectric transducer is provided incorporating a resonant circuit consisting of the piezoelectric transducer and an inductance, which resonant circuit is directly excited by means of a current pulse having a predetermined duration, whereby the shape of the voltage applied to the resonant circuit is determined by the wave shape of the current pulse, and including a damping element for damping the oscillation of the resonant circuit initiated by the current pulse, such damping being delayed by a time interval following the onset of said current pulse.

In the use of the present invention, in addition to the considerable space saving and cost reduction, achieved as a result of employing commercially available and economical components, the present invention also achieves the advantage that the wave form of the drive pulse for the piezoelectric transducer can be predetermined solely by controlling the wave shape of the drive pulse for the resonant circuit. A considerably lower power requirement is realized, since no transformer is required. Also, the temperature dependency of the previously known circuit is reduced to a considerable degree.

As a result of the delayed damping of the resonant circuit, whereby only individual half waves of the resonant circuit voltage are damped, it is possible to provide a large voltage swing which insures good droplet ejection characteristic, but nevertheless guarantees a fast decay of the oscillation. The amount of damping employed can be selected to bring about the most effective operation.

In another embodiment of the present invention, the damping element may be connected either in parallel or in series with the inductance. The series connection gives the advantage of the noticeable increase in the voltage swing.

In yet another further development of the present invention, the drive stage may be connected to a voltage supply over a resistor having a high resistance value, which supplies a reliable overload protection.

These and other objects and advantages of the present invention will become manifest by an inspection of the following description and the accompanying drawings:

BRIEF DESCRIPTION OF THE DRAWINGS

Reference will now be made to the accompanying drawings in which;

FIG. 1 is a schematic diagram of an illustrative embodiment of the present invention, without a damping element;

FIG. 2 illustrates wave forms serving to explain the operation of the circuit of FIG. 1.

FIG. 3 is a schematic circuit diagram of an arrangement incorporating the present invention together with one example of a damping element;

FIG. 4 is a schematic circuit diagram of an arrangement incorporating the present invention with an alternative damping element;

FIG. 5 illustrates wave forms serving to explain the operation of FIG. 3 and 4; and FIGS. 6 and 7 show variations in the drive circuits of FIGS. 3 and 4.

DESCRIPTION OF THE PREFERRED EMBODIMENTS

Referring now to FIG. 1, a drive circuit is shown for a piezoelectric transducer 1. An inductance 2 forms a parallel resonant circuit with the transducer 1. The circuit has an input terminal 3, to which a voltage pulse 4 is applied, and this voltage pulse is amplified by a driver element 5 and applied to the base of transistor 6.

The collector of the transistor 6 is connected to the parallel resonant circuit including the transistor 1 and the inductance 2, with the transducer being connected to the collector through a coupling compacitor 9. A resistor 10 is connected in parallel with the transistor 1. A pair of resistors 7 and 8 are connected in series between the emitter of the transistor 6 and a source of reference potential Ur, and a bias resistor 6a is connected between the source of reference potential and the base of the transistor 6. The transistor 6 functions as a current source when the voltage is applied to its base, and the unipolar pulse produced in response the voltage pulse 4 excites the resonant circuit. The amplitude of the current of the current pulse is determined by the values of resistor 7 and 8, in series with the emitter of the transistor 6, as well as the value of the reference voltage Ur.

In a practical example, using the circuit of FIG. 1, a drive current 14.1 mA is produced, using a supply voltage of $-200$ volts for $-$Uo. The voltage applied to the transducer 1 is adjustable or variable in the range between 60 volts to 300 volts, by varying the resistance of the variable resistor 8. It is also possible to control the voltage level applied to the transducer 1 by placing the variable resistor 8 in series with the base of the transistor 6.

The coupling capacitor 9 has a capacitance which is greater than that of the piezoelectric transducer 1, and serves to decouple the transducer 1. The transducer 1 and the resistor 10 have a common terminal connected to ground. The resistor 10 has a high resistance value, but is optional. By employing the resistor 10, it is guaranteed that both terminals of the transducer 1 are at ground potential in the quiesent state of the transducer.

The duration $\Delta$ of the current pulse 4, and the level of voltage supplied to the resonant circuit 1 are matched to each other, so that the first maximum of the oscillation within the resonant circuit, resulting from the application of the current pulse 4, appears after the expiration of the duration $\Delta$. A second oscillation, caused by the trailing edge of the pulse 4, is excited, which is phase shifted by the duration in comparison to the first oscillation, and has the opposite operational sign.

The circuit may be analyzed as producing a composite output voltage curve in response to the summation of the voltages produced in response to two step functions which overlap to form a unipolar DC pulse having the length $\Delta$. The two elemental voltage curves represent elemental waveforms which add together to form the composite wave form or voltage curve applied across the parallel resonant circuit.

This is illustrated in FIG. 2, where the voltage curve arising from one step function, at the onset of the current i, is identified by the U1, with the voltage arising from the trailing edge of the pulse identified as U2. The two curves add together to form the composite voltage U. Without considering damping influences, the voltage U corresponds to the voltage U1 up to the expiration of the time span $\Delta$, and afterwards corresponds to a cosine oscillation, phase shifted by one half $\Delta$.

The effect of this composite waveform is that the piezoelectric transducer first expands, and then constricts, and finally expands again. It is expedient to limit the oscillation to avoid uncontrolled droplet ejection after excitation of the circuit, so that the system can quickly reassume its quiesent state following droplet ejection, preparatory to initiating a further droplet ejection. Accordingly, a damping element is preferably connected in parallel with the inductance of the resonant circuit, as shown in FIG. 3, or in series therewith as shown in FIG. 4.

A feature of the damping circuit shown in both FIGS. 3 and 4 is that the damping does not begin immediately, but is delayed by a time delay. This delay is made possible because the voltage waveform has a zero axis crossing, in the case of the parallelly connected damping element of FIG. 3, and the current through the inductance 2 undergoes a reversal of direction in the series connection arrangement of FIG. 4.

FIG. 5 illustrates the effect of the series connected damping element employed in FIG. 3. Line 1 of FIG. 5 shows the DC pulse having a current amplitude i and duration $\Delta$. Line 2 of FIG. 5 shows the waveform of the current pulse through the inductance 2, with component i21 indicating the waveform of the current resulting from the leading edge of the pulse, and the waveform i22 indicating the current due to the trailing edge of the pulse. The composite current waveform i2 is formed by the superposition of the two component waveforms i21 and i22. The current i2 changes its direction twice, as indicated on line 2.

As illustrated in Line 3, the voltage U, which as described above, is formed as the combination of the component voltages U1 and U2, reaches its first negative maximum at the same time as the current i2 changes direction. From this time on, the diode 13, connected in series with the inductance (FIG. 4) of the damping element, is blocked, and the loss resistor 14 is effectively connected in series with the inductance 2. Accordingly, the negative-going half waveform of the current i2 is damped, beginning at the time of $\omega t2$, which is delayed relative to the time duration of the applied voltage pulse.

The damping function for the parallelly connected damping circuit of FIG. 3 is similar. Since the voltage U (line 3 of FIG. 5) crosses the zero axis at time $\omega t1$, the damping of the parallel arrangement shown in FIG. 3 begins at this time, and continues for the duration of the negative-going half cycle of the waveform U. With suitable values of the resistors 12 or 14 for the damping circuits, the decay characteristic illustrated in line 4 can be realized. Since the negative going half waves are each damped, the subsequent positive going half waves are affected to a corresponding extent. If desired, the resistors 12 and 14 can be dimensioned to provide for critical damping, or for the so-called aperiodic limiting case, so that the amplitude can decay with overshooting.

Voltage amplitudes which are considerably above the value of the supply voltage Uo can be achieved with the circuits of the present invention. For example, given a supply voltage Uo=200 volts, an overall amplitude in excess of 300 volts can be achieved at the transducer 1, and an overall amplitude of 300 volts can be achieved with a supply voltage of only 125 volts, using the series damping circuit shown in FIG. 3.

In order to increase the protection for the transducer, in case of a short circuit within the transistor 6, or a short in the coupling capacity 9, it is advantageous to provide a resistor having a high resistance value in the collector circuit of the transistor 6. Sample embodiments of such an arrangement are shown in FIGS. 6 and 7, where it is seen that a protective resistor 15 is connected in series with the collector. The value of the resistor 15 is chosen to provide that the coupling capacitor 9 is completely charged after each ejection event. FIGS. 6 and 7 also show arrangements in which the inductance 2 is returned to ground potential, instead of to the potential -Uo. FIG. 6 illustrates a parallel damping circuit (corresponding to FIG. 3), while FIG. 7 illustrates a damping circuit (corresponding to FIG. 4) in series with the inductor 2.

It will be appreciated by those skilled in the art that various modifications and additions may be made in the apparatus of the present invention without departing from the essential features of novelty thereof, which are intended to be defined and secured by the appended claims.

What is claimed is:

1. Apparatus for driving a piezoelictric transducer surrounding a fluid ink path in an ink jet printer, said transducer being adapted to expand upon application of a voltage poled opposite to the polarization direction of the transducer, and constricting in response to application of an oppositely poled voltage, including, in combination; a resonant circuit having a two-terminal inductor and a piexoelectric transducer functioning as a capacitance, means including a transistor having its collector conductively connected to said inductor for exciting said inductor directly by means of a current pulse having a predetermined duration flowing between its two terminals, the waveform of the voltage applied to said piezoelectric transducer being determined by the shape of said current pulse, and including a damping circuit connected in series with said inductor for damping the voltage waveform applied to said transducer, said damping beginning after a time interval delay relative to the beginning of oscillation of said resonant circuit initiated by said current pulse and damping said voltage waveform after the conclusion of said current pulse.

2. A circuit arrangement according to claim 1, wherein said damping circuit comprises a polarity-dependent switch element and a damping resistor connected in parallel with said switch element, said damping member being effective to damp said voltage waveform after the second maximum of an oscillation.

3. A circuit arrangement according to claim 2 including a resistor connected to the collector of said transistor, said resonant circuit being connected by a capacitor to the collector terminal of said transistor, said resistor having a value such that the capacitor is fully charged between two successive current pulses.

* * * * *